(12) United States Patent
Stanley

(10) Patent No.: US 7,557,622 B2
(45) Date of Patent: Jul. 7, 2009

(54) PRECISION TRIANGLE WAVEFORM GENERATOR

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 110 days.

(21) Appl. No.: 11/542,756

(22) Filed: Oct. 3, 2006

(65) Prior Publication Data

US 2007/0109029 A1 May 17, 2007

Related U.S. Application Data

(60) Provisional application No. 60/727,404, filed on Oct. 17, 2005.

(51) Int. Cl.
*H03K 4/06* (2006.01)
(52) U.S. Cl. .................. 327/131; 327/132; 327/135; 327/137
(58) Field of Classification Search ................ 327/131, 327/132, 135, 137
See application file for complete search history.

(56) References Cited

U.S. PATENT DOCUMENTS 4,620,162 A  10/1986  Quittkat et al.
5,394,020 A *  2/1995  Nienaber ................ 327/140
6,819,154 B2 * 11/2004  Greenfeld ............... 327/172
7,403,049 B2 *  7/2008  Uchimoto et al. ........ 327/131
2004/0169553 A1  9/2004  Maejima

FOREIGN PATENT DOCUMENTS

| JP | 55153406 | 11/1980 |
|----|----------|---------|
| JP | 02146957 | 6/1990 |
| JP | 2004104645 | 4/2004 |

OTHER PUBLICATIONS

Search Report dated Feb. 7, 2007, for corresponding International Application No. GB0620052.1.

* cited by examiner

*Primary Examiner*—Kenneth B. Wells
(74) *Attorney, Agent, or Firm*—Brinks Hofer Gilson & Lione

(57) ABSTRACT

A triangle waveform generator is set forth that comprises a capacitive element, a regulator, and a control circuit. The regulator is configured to charge the capacitive element in responsive to a first control signal and to discharge the capacitive element in response to a second control signal. The control circuit is responsive to a reference waveform to generate the first and second control signals. In one example, the control circuit generates the first and second control signals in response to the amplitude, frequency, phase, and symmetry of the reference waveform.

23 Claims, 5 Drawing Sheets

PRECISION TRIANGLE WAVEFORM GENERATOR

PRIORITY CLAIM

This application claims the benefit of priority from U.S. Provisional Application No. 60/727,404, filed Oct. 17, 2005, which is incorporated by reference.

BACKGROUND OF THE INVENTION

1. Technical Field

This invention relates generally to pulse width modulated power converters, and more specifically to a precision triangle waveform generator that generates a triangle wave used, for example, in interleaved pulse width modulation amplifiers.

2. Related Art

Pulse width modulation (PWM) amplification for audio applications has been used to increase efficiency by incorporating output devices that act as switches as opposed to linear devices that must dissipate a substantial amount of power. In PWM amplifiers, an audio input signal is converted to a pulse width modulated waveform. To this end, an audio signal is provided to the amplifier to modulate the width of a rectangular waveform based, for example, on the amplitude of the audio signal. The modulated waveform is used to drive one or more output devices as switches that are either fully saturated or off. The output devices, often implemented using switching power transistors, may be aligned in half-bridge pairs such that one device of the pair switches a positive voltage to the output, while the other device switches a negative voltage to the output. The switched output signals may be provided to the input of a low-pass filter in an attempt to remove harmonic signals and sidebands that are beyond the spectrum of the desired output waveform. The filtered analog signal is used to drive the load, such as a loudspeaker.

Triangle waveform generators are used to modulate the audio signal to generate the pulse width modulated waveforms. Such triangle waveform generators may employ voltage controlled oscillators whose frequency is responsive to a certain control voltage. The triangle wave generated by such a triangle waveform generator may be phase locked to a reference frequency. The triangle wave may be modulated by the control voltage to map the amplitude into pulse width. Presently, triangle waveform generators are not capable of concurrently controlling one or more of the wave amplitude, frequency, symmetry and/or phase. Thus, systems and methods to more accurately control the quality of the triangle waveform are needed.

SUMMARY

A triangle waveform generator is set forth that comprises a capacitive element, a regulator, and a control circuit. The regulator is configured to charge the capacitive element in response to a first control signal and to discharge the capacitive element in response to a second control signal. The control circuit is responsive to a reference waveform to generate the first and second control signals. In one example, the control circuit generates the first and second control signals in response to the amplitude, frequency, phase, and symmetry of the reference waveform.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
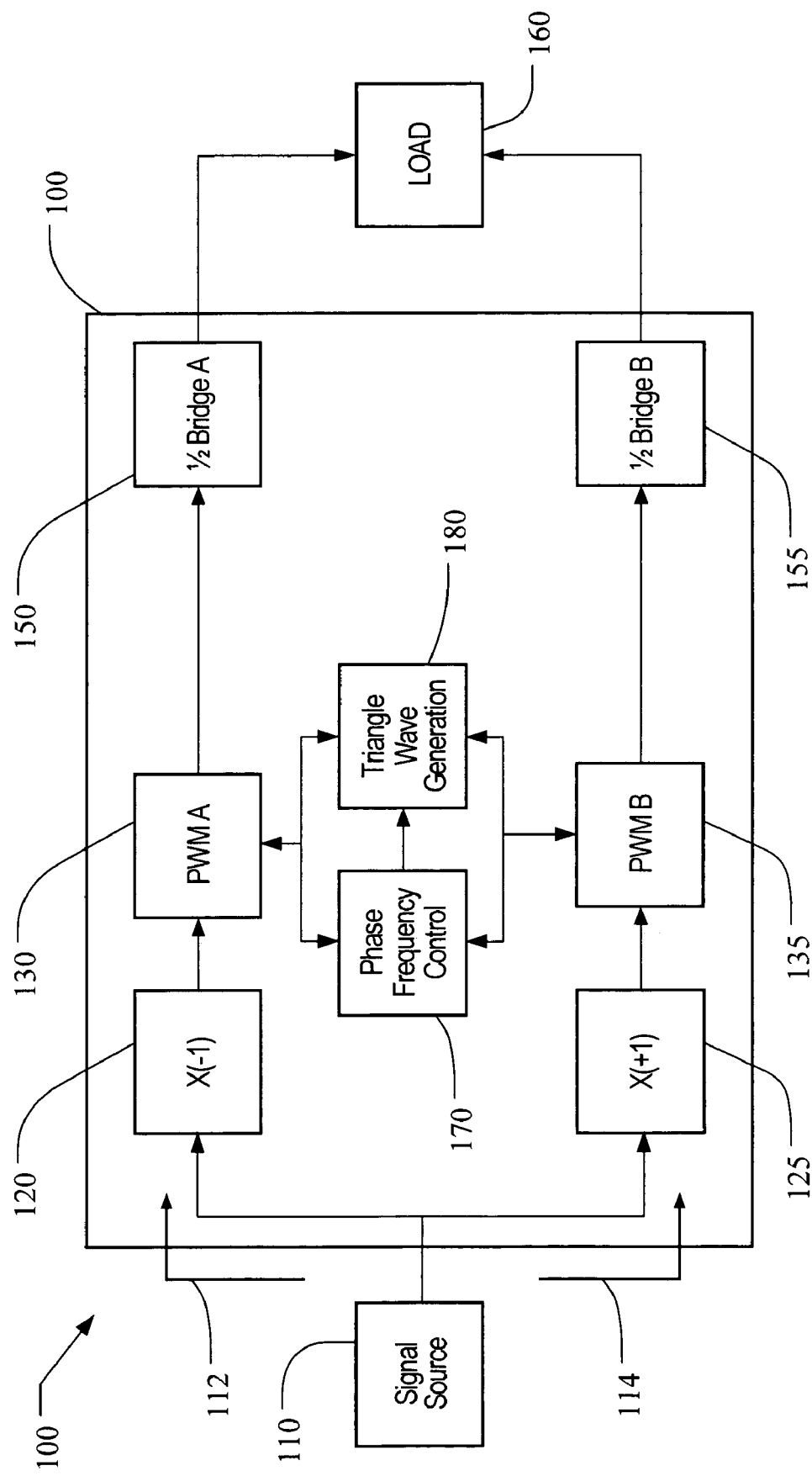
FIG. 1 is a schematic block diagram of a pulse width modulated amplifier having an interleave order of two.

FIG. 1 is a block diagram of an example interleave of two (N=2) full-bridge pulse width modulated (PWM) amplifier 100. The interleaved PWM amplifier 100 receives an input signal from a signal source 110. The input signal may be split into a first branch 112 and a second branch 114. The first branch 112 includes an inverting block 120 configured to invert the input signal. The inverting block 120 is connected with a first pulse width modulator 130, referenced as PWM A. PWM A 130 is connected with a first half-bridge 150, referenced as half bridge A. The output of half-bridge A 150 is then connected with a load 160.

The inverted input signal may be modulated onto a first triangle waveform with N=2 PWM modulation by the PWM A 130. Generation of the first triangle waveform involves generation of a switching frequency (Fs) for each output channel supplied to the load 160 using a phase frequency control system 170. The switching frequency(s) (Fs) may be used by a triangle wave generation system 180 to generate the first triangle waveform. Modulation of the inverted input signal onto the first triangle waveform results in a first control signal. The first control signal may be provided to the first half-bridge 150 to control the power output to the load 160. The second branch 114 includes a non-inverting block 125 that is connected with a second pulse width modulator 135, referenced as PWM B. PWM B 135 similarly modulates the non-inverted input signal onto a second triangular waveform to generate a second control signal using a phase frequency control system 170 and a triangle wave generation system 180. The second control signal may be provided to a second half-bridge 155, referenced as PWM B, to control the power output to the load 160.

In one example, the phase frequency control system 170 and the triangle wave generation system 180 may be functionally provided in the form of an integrated circuit. Such an integrated circuit would allow lower cost and a smaller size. Multiple channels of triangle waveform generation could be included within one package. The integrated circuit may be operated from a common reference clock with exacting phase control. In other examples, the functionality of the phase frequency control system 170 and the triangle wave generation system 180 may be formed as separate components, or in any combination of separate components and one or more integrated circuits.

Figure 2:
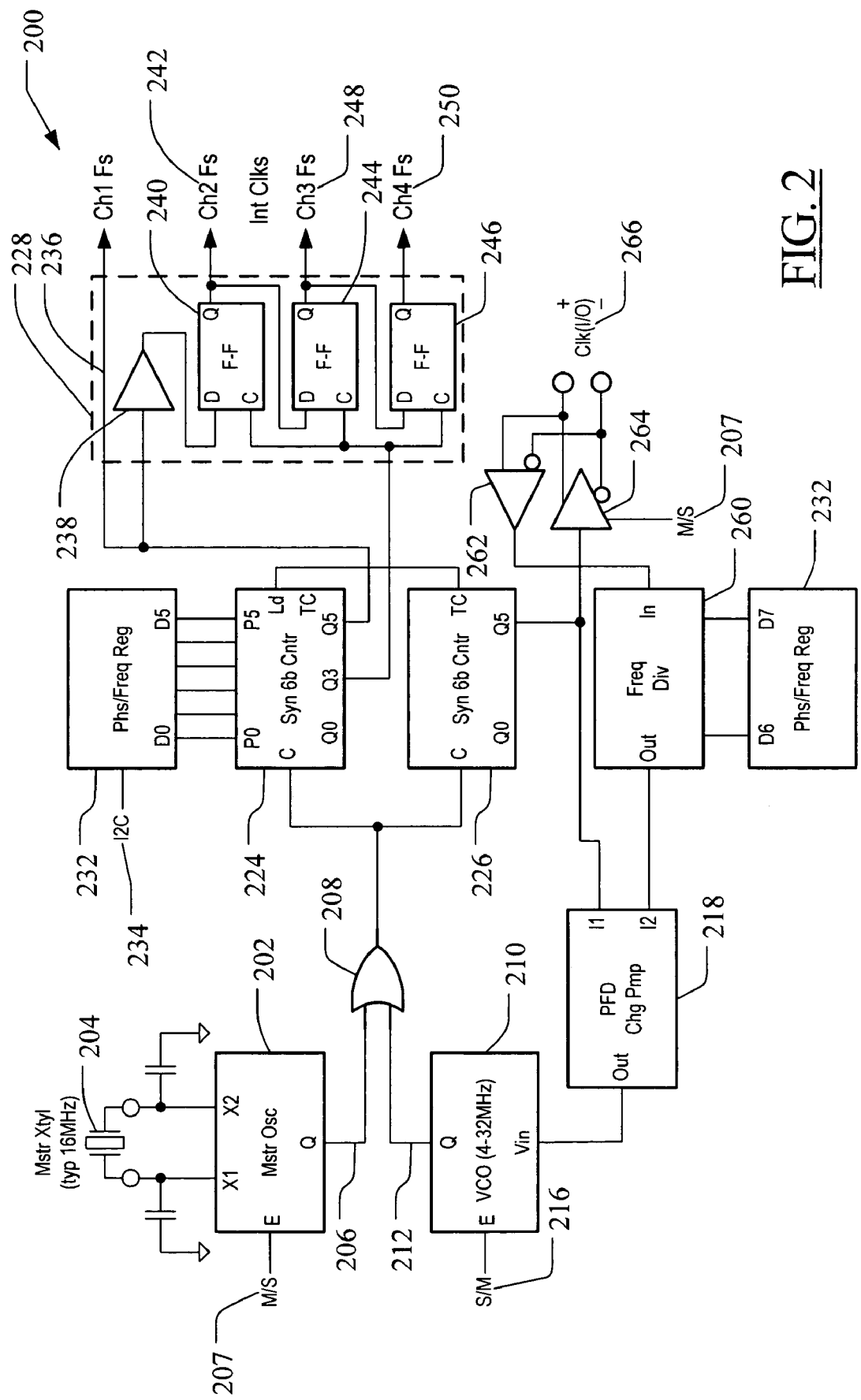
FIG. 2 is a schematic block diagram of an exemplary phase frequency control system that may be employed in the system shown in FIG. 1.

FIG. 2 is a block diagram of an example phase frequency control system 200 for a pulse width modulator. The phase frequency control system 200 may be formed as an integrated circuit and/or as interconnected independent components. The following discussion of an example configuration is based on a phase frequency control system 200 formed in an integrated circuit. In FIG. 2, a master oscillator 202 is operated with a master crystal 204 to generate a master oscillator output signal on a master output line 206 when enabled by a master slave (M/S) signal 207. The master crystal 204 may be external to the integrated circuit as indicated by the circles in FIG. 2 representative of input/output pins on the integrated circuit. The master crystal 204 may dictate a predetermined frequency, such as 16 MHz, from the wide range of frequencies for which a crystal may be used to generate a frequency. The first output signal 206 may be provided to an OR gate 208. A voltage controlled oscillator 210 may provide a voltage controlled output signal on a voltage controlled line 212 to the OR gate 208 when enabled by a slave master (S/M) signal 216. The voltage controlled oscillator 210 may receive a control signal from a phase frequency detector charge pump 218.

The voltage controlled oscillator 210 may be a slave that operates independent of the master oscillator 202 when the master oscillator 202 is unavailable. Alternatively, since the master oscillator 202 operates with a fixed predetermined frequency, the master oscillator 202 may be disabled and the voltage controlled oscillator 210 may be enabled to operate the phase frequency control system 200 at other than a fixed predetermined frequency.

An output of the OR gate 208 may be supplied to a first synchronous counter 224 and a second synchronous counter 226. The first and second synchronous counters 224 and 226 are configured to count full length and provide output bits that all change at the same time to provide phase control between a plurality of output channels 228. In one example, the first and second synchronous counters 224 and 226 may be 6 bit synchronous counters. The first and second synchronous counters 224 and 226 may be operated with a phase frequency register 232 that provides a first value for the first synchronous counter 224. Alternatively, the first and second synchronous counters 224 and 226 may have separate and independent registers.

The register(s) 232 of the first and second synchronous counters 224 and 226 may be non-volatile and loaded with values that result in a fixed frequency control by the phase frequency control system 200. Alternatively, the register(s) 232 may be volatile and may be loaded with one or more values that result in a variable frequency. For example, only the second synchronous counter 226 may be provided with non-volatile memory in which a value may be stored. In this example, following power up and operation to increment the second synchronous counter 226, the second synchronous counter 226 may load a value into the first synchronous counter 224 when the second synchronous counter 226 counts to a predetermined condition. In yet another alternative, one or both values may be loaded into the register(s) 232 by an I2C signal on an I2C signal line 234. In other examples, any other communication system and/or protocol may be used to download values into the register(s) 232.

The output channels 228 are switching frequency signals (Fs) that are maintained as internal signals within the integrated circuit and provided to the triangle wave generation system 180 (FIG. 1). In FIG. 2, there are four output channels 228, in other examples, any other number of output channels 228 may be generated depending on the load being supplied. A first switching frequency signal may be provided on a first channel (Ch1 Fs) 236. The first switching frequency signal may be generated from the first synchronous counter 224 when a predetermined value is reached on a predetermined bit, such as bit Q5, of the synchronous counter 224.

The first switching frequency signal may be delayed by a buffer 238, and then provided as an input to a second output channel flip-flop 240. The second output channel flip-flop 240 may be toggled based on a clock signal provided as an output value from the synchronous counter 224. The output value may be another bit, such as bit Q3, of the first synchronous counter 224. The output of the second output channel flip-flop 240 may be a second switching frequency signal (Fs) provided on a second channel (Ch2 Fs) 242. A third output channel flip-flop 244 and a fourth output channel flip-flop 246 may be further sequentially delayed before generating a third switching frequency signal provided on a third channel (Ch3 Fs) 248 and a fourth switching frequency signal provided on a fourth channel (Ch4 Fs) 250, respectively. Each of the first, second, third and fourth switching frequency signals may be offset from each other by determined amount so that the interleaved power converter produces vectors that are evenly spread, such as by about 22.5 degrees. In other examples, other systems and methods may be used to generate the offset first, second, third and fourth switching frequency signals on the respective channels.

The phase frequency control system 200 also includes a frequency divider 260, a balanced receiver 262 and a balanced transmitter 264. The frequency divider 260 may be used to generate a lower frequency when the voltage controlled oscillator 210 is enabled. The generated frequency may be lower than the frequency of an external reference clock 266 provided from another master clock, such as another integrated circuit or a power supply. The external reference clock 266 may be provided to the frequency divider 260 by the balanced receiver 262. The external reference clock 266 may be received from a source external to the integrated circuit of the present example, as illustrated by the circles depicting input/output pins of the integrated circuit. The balanced receiver 262 may operate as a buffer that is balanced to reduce electromagnetic fields (EMF) and improve signal-to-noise ratios (S/N) within the integrated circuit. Accordingly, when the master oscillator 202 is not available (or disabled), the voltage controlled oscillator 210 and the phase frequency detector charge pump 218 may operate at the frequency reference and/or one or more reduced frequencies provided by the frequency divider 260 based on the frequency reference provided by the balanced receiver 262.

When the master oscillator 202 is enabled, the balanced transmitter 264 may similarly be enabled with the same master/slave signal 207. The balanced transmitter 264 may provide a signal representative of the master oscillator 202 as the external reference clock 266. When the master oscillator 202 is operating, the external reference clock 266 may be provided as a frequency reference to other devices external to the integrated circuit.

During operation, the phase frequency control system 200 is capable of generating a plurality of channels of switching frequency (Fs) signals that are offset in phase from each other by a determined amount. The pulse width modulator may modulate waveforms in the form of triangular waveforms that encode amplitude information into pulse width information based on the switching frequency (Fs) signals.

The ability to the control phase of the switching frequency signals (Fs) is useful to minimize signal corruption resulting from switching noise crosstalk. If all the output channels 236, 242, 248 and 250 are operated in precise synchrony, there is maximum opportunity for crosstalk. The act of phasing channels such that they have a maximum amount of time between each other's switching events minimizes signal corruption from crosstalk transients. In other words, the distance between switching of pairs of switches may be maximized to minimize crosstalk.

The phase frequency control system 200 may include precise control of relative phase to divide the modulation period into evenly tempered intervals between all of the output channels 236, 242, 248 and 250. The phase frequency control system 200 also may operate to control phase when interleaved modulation is required at interleave numbers of four or more. A single triangle waveform is adequate for an interleave of two as illustrated in FIG. 2.

Figure 3:
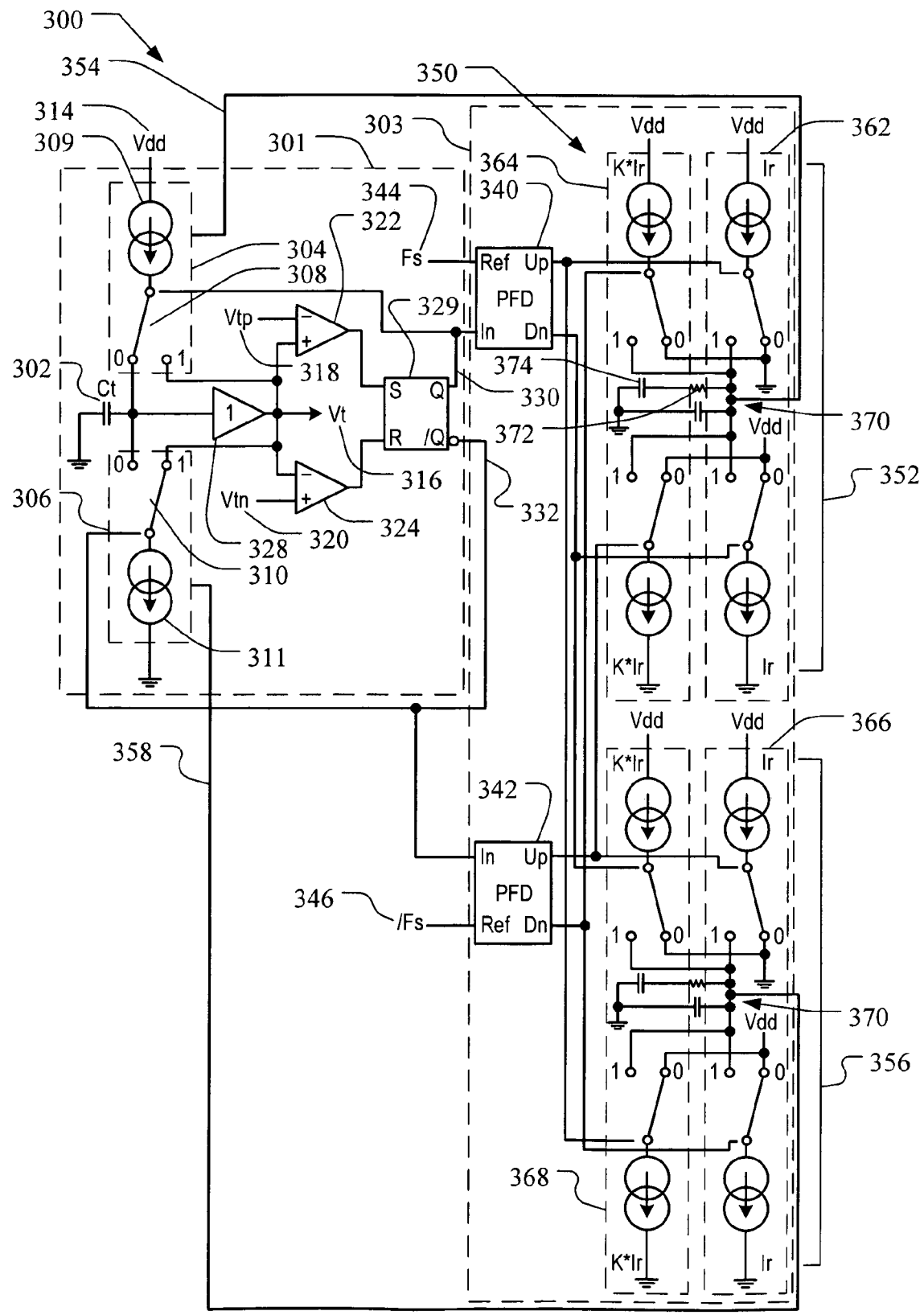
FIG. 3 is a schematic block diagram of an exemplary triangle wave generation system that may be employed in the system shown in FIG. 1.

FIG. 3 is a schematic block diagram of a triangle wave generation system 300 that may be used to implement the triangle wave generation system 180 illustrated in FIG. 1. The triangle wave generation system 300 may be formed as an integrated circuit and/or as interconnected independent components. The following discussion of an example configuration is based on a triangle wave generation system 300 formed in an integrated circuit.

In FIG. 3, the triangle wave generation system 300 includes a voltage controlled oscillator 301 and a phase frequency detector charge pump 303. A triangle wave is formed with the voltage controlled oscillator 301 by charging and discharging a capacitor Ct 302. Capacitor Ct 302 may be of an advantageous form for an integrated circuit in that it has one end grounded and the other end driven. This may be advantageous since fringing capacitance is relatively large with integrated circuit capacitors and the fringing capacitance is now in parallel with the intended capacitance.

Capacitor Ct 302 may be selectively charged and discharged with a charge regulator 304 and a discharge regulator 306. The charge regulator 304 includes a charge current switch 308 and a charge current source 309. The discharge regulator 306 includes discharge current switch 310 and a discharge current source 311. The charge current source 309 and the discharge current source 311 may be supplied with a supply voltage (Vdd) 314, such as 5 volts DC and ground. In addition, the magnitude of current supplied by each of the current sources 309 and 311 and the current switches 308 and 310 may be controlled.

Selective switching of the respective current switches 308 and 310 and control of the respective current sources 309 and 311 may control a voltage (Vt) 316 present on the capacitor Ct 302. The voltage (Vt) 316 may be compared with a positive potential voltage Vtp 318 and a negative potential voltage Vtn 320 by a first comparator 322 and a second comparator 324 included in the voltage controlled oscillator 301.

The positive and negative potential voltages Vtp 318 and Vtn 320 may be representative of the output rails of the PWM amplifier 100 illustrated in FIG. 1. The positive and negative potential voltages Vtp 318 and Vtn 320 may be centered on a determined voltage such as a CMOS voltage of 2.5 volts DC or a separate voltage of ground potential, or zero volts. The voltage (Vt) 316 may be buffered by a buffer 328 prior to being compared by the first and second comparators 322 and 324. The first and second comparators 322 and 324 may form a window detector. The comparator outputs may be used to toggle a hysteresis switch 329, such as an R-S flip-flop. The hysteresis switch 329 may enable control of the charging and discharging currents that manipulate the charge on the capacitor Ct 302.

Control of the charging and discharging currents provided by the charge current source 309 and the discharge current source 311 may be performed with the phase frequency detector charge pump 303. The voltage controlled oscillator 301 may generate triangle waves when the charge current source 309 and the discharge current source 311 are programmed by common frequency control signals provided by the phase frequency detector charge pump 303. The phase frequency detector charge pump 303 may control the currents of the charge current source 309 and the discharge current source 311 to be tracking currents that are approximately equal and opposite in magnitude.

In the triangle wave generation system 300, the charge current source 309 and the discharge current source 311 are separately regulated to allow precise control of the two ramps that form the triangle waveform. A first window comparator output signal on a first window comparator output line 330 and a second window comparator output signal on a second window comparator output line 332 may be provided as a logic one or a logic zero by the hysteresis switch 329. The outputs of the hysteresis switch 329 are provided to the phase frequency detection charge pump 303 and are also operable to control the operation of the charge and discharge current switches 308 and 310 in the respective first and second regulators 304 and 306.

The phase frequency detection charge pump 303 includes a first phase frequency detector 340 and a second phase frequency detector 342. During operation, the first and second phase frequency detectors 340 and 342 each compare an edge of the triangle wave to a reference switching frequency signal (Fs) 344 and an inverted reference switching frequency signal/Fs 346. The reference switching frequency signal (Fs) 344 is provided by the phase frequency control system 200 (FIG. 2). The first and second phase frequency detectors 340 and 342 compare the edges and the reference signals for frequency and symmetry.

The phase frequency detectors 340 and 342 may be digital detectors that make the comparison and activate a group of charge pumps 350 in such manner as to effect the intended controls. More specifically, the group of charge pumps 350 includes a first set of charge pumps 352 that are operated to generate a charge current control signal on a charge current control line 354. In addition, a second set of charge pumps 356 are operated to generate a discharge current control signal on a discharge current control line 358. Thus, two separate and somewhat independent control loops may independently control the charge current source 309 and the discharge current source 311.

The first group of charge pumps 352 include a first main charge pump 362 and a first cross-coupled charge pump 364. Similarly the second set of charge pumps 356 includes a second main charge pump 366 and a second cross-coupled charge pump 368. In other examples, the number of sets of charge pumps and/or the number of charge pumps used may be increased or decreased. During operation both of the first and second phase-frequency detectors 340 and 342 may converge on zero degrees error. Under zero degrees error conditions, both the "up" and "down" outputs of the first and second phase-frequency detectors 340 and 342 are on, thereby turning on the charge pumps 362, 364, 356, 358 equally and oppositely, resulting in zero. Outputs on the charge and discharge current control lines 354 and 358 are provided to the charge regulator 304 and discharge regulator 306, respectively.

In one example control scheme each detector 340 and 342 may manipulate the charge pump that controls the ramp that enabled the edge of the hysteresis switch 329 that was compared with the like reference switching frequency signal (Fs). With this approach, however, it is not a convergent scheme. Increasing the ramp speed of one edge will advance the event timing of more than the intended edge. The total interaction of the edges may result in the two control loops fighting each other during operation. When one advances its event it advances the other event causing the other's controller to retard both events.

To implement and maintain real control, filtering of control signals that are slow relative to the principal signals being processed and regulated may be used. Large capacitors, such as greater than 100 picofarads capacitors, may be included in the triangle wave generation system 300 for filtering in the control circuits. Since integration of large capacitors into an integrated circuit may be difficult, added package terminals may be included to connect the integrated circuit to external capacitors. Alternatively, a charge pump circuit in the integrated circuit, as depicted in FIG. 3, may be used to filter slower control signals instead of the large capacitors. Such a charge pump circuit may operate similar to a charge pump used with a digital phase-frequency detector on a phase-locked or delay-locked loop. The lock point may be at zero phase where the control signals become very narrow and impulsive. At zero degrees the charge up and down pulses may become very narrow and time coincident, canceling each other's charge output. With little to no ripple at lock conditions, it may be relatively easy to filter such a signal using only small capacitors in a low-leakage circuit. The ripple may be large when out of lock, but such is not an operating mode.

To implement and maintain real control, filtering of control signals that are slow relative to the principle signals being processed and regulated may be used. Large capacitors, such as greater than 100 picofarads capacitors, may be included in the triangle wave generation system 300 for filtering in the control circuits. Since integration of large capacitors into an integrated circuit may be difficult, added package terminals may be included to connect the integrated circuit to external capacitors. Alternatively, a charge pump circuit in the integrated circuit, as depicted in FIG. 3, may be used to filter slower control signals instead of the large capacitors. Such a charge pump circuit may operate similar to a charge pump used with a digital phase-frequency detector on a phase-locked or delay-locked loop. The lock point may be at zero phase where the control signals become very narrow and impulsive. At zero degrees the charge up and down pulses may become very narrow and time coincident, canceling each other's charge output. With little to no ripple at lock conditions, it may be relatively easy to filter such a signal using only small capacitors in a low-leakage circuit. The ripple may be large when out of lock, but such is not an operating mode.

The four charge pumps 362, 364, 366 and 368 may allow the implementation of a convergent controller within the triangle wave generator 301. The cross-coupled charge pumps 364 and 368 may be weighted (Factor K) with a current magnitude, which is less than the main charge pumps 362 and 366. That is to say, the factor K must be less than one. If K were equal to one, frequency control may be diminished. If K were greater than one, the frequency control may be divergent. Therefore K can be some positive number greater than zero, but less than one. An example value of K is K=0.5.

To be stable, each control loop may have a zero introduced in its control loop. Such is the purpose of a series RC network 370 include in a charge storage network of each of the first and second set of charge pumps 352 and 356. Each of the RC networks 370 includes at least one resistor 372 and at least one capacitor 374. In other examples, other quantities and configurations of resistors and capacitors than what is illustrated may be used. The resistance value of the resistor(s) 372 may be relatively large, but may not require precision. Thus the resistor(s) 372 may be readily integrated in a CMOS mixed-signal process.

The triangle wave generation system 300 also may include amplitude adjustment of the triangular waveforms to enable feed-forward compensation of open-loop converter gain. This may be done by causing the triangular waveforms to be proportional in amplitude to the power supply voltages in the power converter stages, the half bridges 150 and 155 of FIG. 1. When the triangular waveforms are maintained proportional in amplitude to the power supply voltages, the gain may become constant and independent of the supply voltages. Without such compensation the gain may be directly proportional to the supply voltages.

The triangle wave generation system 300 also may operate with different modulating frequencies. For example a power converter used as a simple class-D audio amplifier may be designed with full bandwidth capability and can be modulating at 500 KHz whereas if the power converter were designed for use only at bass frequencies the converter can be modulating at 50 KHz. The frequency and amplitude modulation demands may act together to greatly increase the range of slopes of the triangle wave that are used. The triangle wave generation system 300 may be used in a range of modulation from about 1 MHz to about 50 MHz due to the wide range of possible slopes achievable based on controllable variation in the triangle wave ramp speed. In another example, the triangle wave generation system 300 may be used in a range of modulation from about 50 KHz to about 500 KHz.

The mapping of amplitude into pulse width is substantially without distortion because the triangular waveforms are very linear and have substantially exact symmetry. That is to say, the uniform rising slope of the triangle waveform is substantially equal in magnitude to the falling slope. To allow an error in symmetry is to introduce unwanted PWM spectrum into the output provided to a load as a consequence of phase modulation being added to the output PWM waveform. The triangle wave generation system 300 also may operate without extraneous noise or jitter on the waveform to avoid the likelihood of noise errors appearing in the PWM output. Such errors are magnified by the effective output stage supply voltage.

During operation, the resulting control system may make adjustments at the most opportune points of the triangle waveform. Such opportune points may be, for example, at the tips where the natural discontinuity in the triangle waveform appears at the limits of the modulation process. In other words, the control may grab the triangle waveform at its vertices and regulate it. The control may be formed to be strongly convergent in that both excess and deficient ramp speeds may be corrected proportional to their error to regulate the result.

Figure 4:
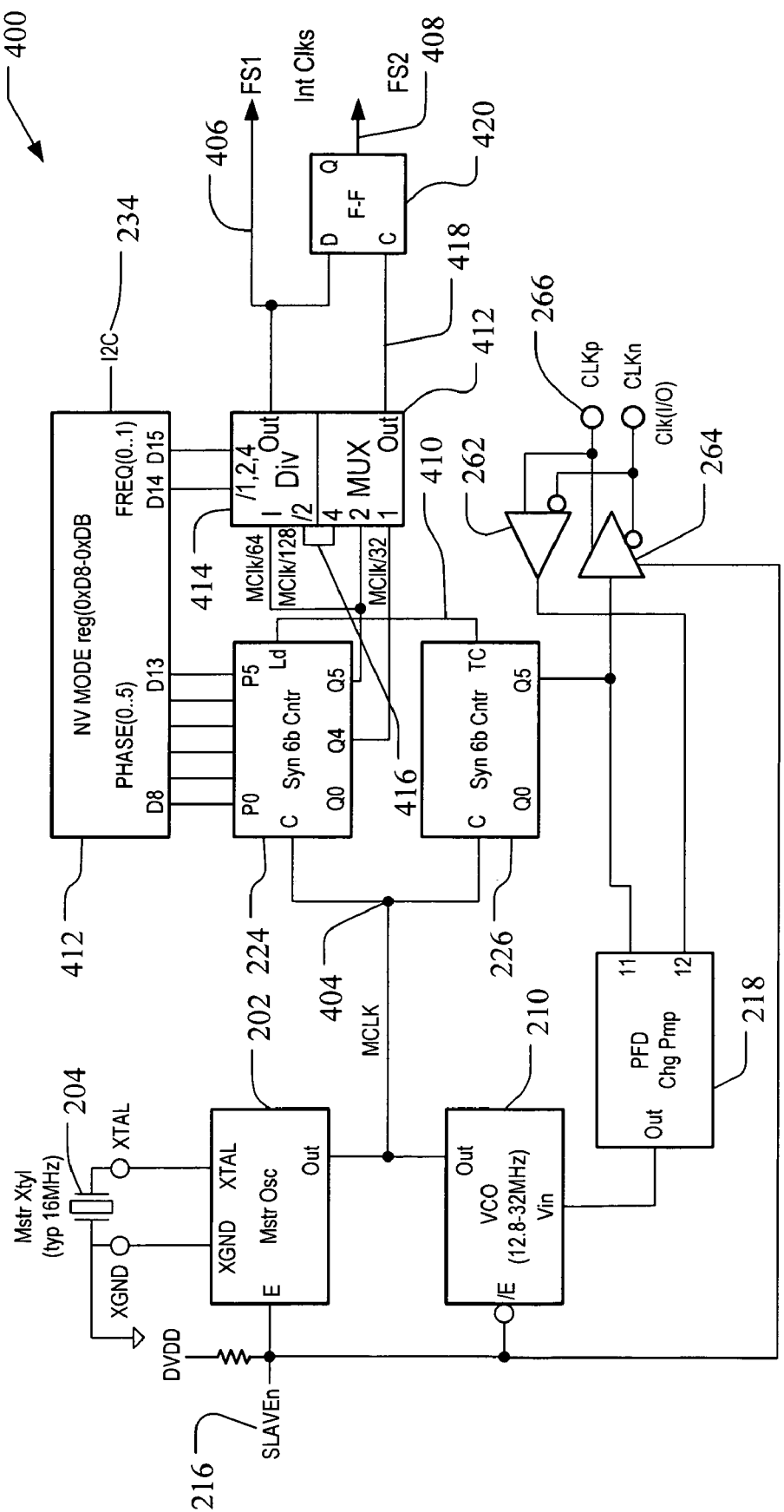
FIG. 4 is a schematic block diagram of a further exemplary phase frequency control system that may be employed in the system shown in FIG. 1.

FIG. 4 is a block diagram of another circuit that may be used to implement the phase frequency control 170 shown in FIG. 1. Circuits similar to those used in FIG. 2 are shown with like reference characters. Like the circuit employed in FIG. 2, circuit 400 may be operated in either of two operational modes. In a master clock mode, the master clock signal 404 is generated based on an internal signal provided by the master oscillator 202 in conjunction with the crystal 204. In a slave mode, the master clock signal 404 is generated by VCO 210 based on the output of a phase frequency detector charge pump 218 that, in turn, is responsive to the external reference clock signal 266.

In the example shown in FIG. 4, the phase frequency control circuit 400 generates two reference signals 406 and 408, although the circuit 400 may be extended to generate additional reference signals. The reference signals 406 and 408 in circuit 400 may have the same frequency and may be in or out of phase with one another. Signals 406 and 408, in turn, are used as reference signals by the triangle wave generator 180 to generate the multiple triangle waves that are used by the pulse width modulators 130 and 135.

Each time counter 226 reaches its terminal count, a signal is generated at line 410 to counter 224 that directs counter 224 to load the value stored in mode register 412 into the counter 224. In the illustrated example, only the data stored at bits D8 through D13 of mode register 412 are loaded into the counter 224. Output bits Q4 and Q5 of counter 224 are connected to the inputs of a multiplexer 412. Output bit Q5 is also provided to the input of a divider 414 that, in turn, divides the frequency at which output bit Q5 for output at line 416. In this exemplary architecture, the inputs to multiplexer 412 comprise a first signal having a frequency of MClk/32, a second signal having a frequency of MClk/64, and a third signal having a frequency of MClk/128. The frequency of the clock signal provided at multiplexer output 418 to the clock input of flip-flop 420 is determined by the state of output bits D14 and D15 of the mode register 412. Similarly, output bits D14 and D15 may be used to determine the factor by which the frequency of the signal at Q5 is divided as well as the frequency of the output signal 406. Together, the phase data of bits D8 through D13 and the frequency data of bits D14 and D15 cooperate to direct circuit 400 to generate the reference signals 406 and 408 at the desired frequency and relative phase.

Figure 5:
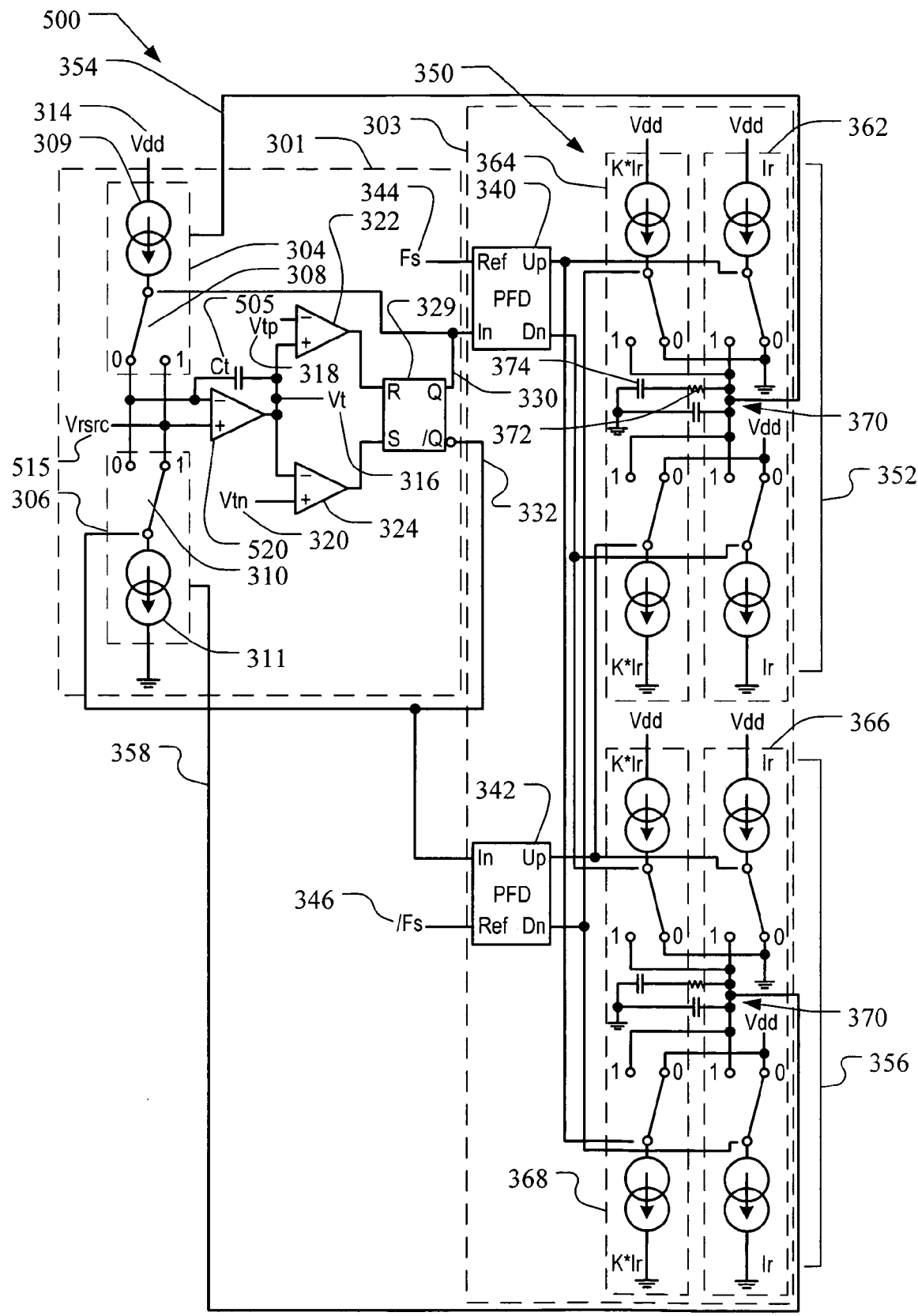
FIG. 5 is a schematic block diagram of a further exemplary triangle wave generation system that may be employed in the system shown in FIG. 1.

FIG. 5 is a schematic block diagram of an alternative version of a triangle wave generation system 500 that may be used to implement the triangle wave generation system 180 illustrated in FIG. 1. System 500 is similar in many respects to the system 300 shown in FIG. 3 and, therefore, like reference characters are used.

Unlike system 300, the capacitor 505 is not reference to real ground. Rather, capacitor 505 is connected to a negative terminal of an operational amplifier 520 so that it is charged with reference to a virtual ground voltage having a voltage level Vrsrc. This architecture facilitates accurate charging and discharging of the capacitor 505 by reducing implementation problems within regulators 304 and 306.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A triangle waveform generator comprising:
a capacitive element;
a regulator configured to charge and discharge the capacitive element, where the regulator is responsive to a first control signal to charge the capacitive element and a second control signal to discharge the capacitive element; and
a control circuit responsive to a frequency and phase of a reference waveform to generate the first and second control signals, where the control circuit comprises
a first set of charge pumps adapted to generate the first control signal, and
a second set of charge pumps adapted to generate the second control signal,
where the first and second set of charge pumps are cross-coupled with one another to generate the first and second control signals.

2. The triangle waveform generator of claim 1, where the control circuit comprises:
a window detection circuit generating a window comparator signal in response to a generated triangle waveform;
a first phase frequency detector generating an output signal in response to the window comparator signal and the reference waveform; and
a second phase frequency detector generating an output signal in response to an inverted version of the window comparator signal and an inverted version of the reference waveform.

3. The triangle waveform generator of claim 2, where the control circuit further comprises:
a first set of charge pumps adapted to generate the first control signal; and
a second set of charge pumps adapted to generate the second control signal.

4. The triangle waveform generator of claim 3, where the first and second sets of charge pumps are cross-coupled with one another to generate the first and second control signals.

5. The triangle waveform generator of claim 3, where the first set of charge pumps comprises:
a main charge pump responsive to the output signal of the first phase frequency detector and an inverted version of the output signal of the first phase frequency detector, where the main charge pump provides a switched current Ir for use in generating the first control signal; and
a secondary charge pump responsive to the output signal of the second phase frequency detector and an inverted version of the output signal of the second phase frequency detector, where the secondary charge pump provides a switched current K*Ir for use in generating the first control signal.

6. The triangle waveform generator of claim 5, where the second set of charge pumps comprises:
a further main charge pump responsive to the output signal of the second phase frequency detector and an inverted version of the output signal of the second phase frequency detector, where the further main charge pump provides a switched current Ir for use in generating the second control signal; and
a further secondary charge pump responsive to the output signal of the first phase frequency detector and an inverted version of the output signal of the first phase frequency detector, where the secondary charge pump provides a switched current K*Ir for use in generating the second control signal.

7. The triangle waveform generator of claim 2, where the window detection circuit comprises:
a first comparator disposed to compare the generated triangle waveform with an upper threshold voltage to generate a corresponding output signal;
a second comparator disposed to compare the generated triangle waveform with a lower threshold voltage to generate a corresponding output signal; and
a flip-flop responsive to the output signals of the first and second comparators to generate the window comparator signal.

8. The triangle waveform generator of claim 7, where the flip-flop is further responsive to the output signals of the first and second comparators to generate the inverted version of the window comparator signal.

9. A triangle waveform generator comprising:
   means for storing an electrical charge;
   regulator means for charging and discharging the means for storing, where the regulator means is responsive to a first control signal to charge the means for storing and a second control signal to discharge the means for storing; and
   control means for generating the first and second control signals in response to a frequency and phase of a reference waveform, where the control means comprises
      a first charge pump means for generating the first control signal, and
      a second charge pump means for generating the second control signal,
      where the first and second charge pump means are cross-coupled with one another to generate the first and second control signals.

10. The triangle waveform generator of claim 9, where the control means further comprises:
    window detection means for generating a window comparator signal in response to a generated triangle waveform;
    first phase frequency detector means for generating an output signal in response to the window comparator signal and the reference waveform; and
    second phase frequency detector means for generating an output signal in response to an inverted version of the window comparator signal and an inverted version of the reference waveform.

11. The triangle waveform generator of claim 9, where the control means further comprises:
    first charge pump means for generating the first control signal; and
    second charge pump means for generating the second control signal.

12. The triangle waveform generator of claim 11, where the first and second charge pump means are cross-coupled with one another to generate the first and second control signals.

13. The triangle waveform generator of claim 11, where the first charge pump means comprises:
    main charge pump means for providing a switched current Ir for use in generating the first control signal in response to the output signal of the first phase frequency detector means and an inverted version of the output signal of the first phase frequency detector means; and
    secondary charge pump means for providing a switched current K*Ir for use in generating the first control signal in response to the output signal of the second phase frequency detector means and an inverted version of the output signal of the second phase frequency detector means.

14. The triangle waveform generator of claim 13, where the second charge pump means comprises:
    further main charge pump means for providing a switched current Ir for use in generating the second control signal in response to the output signal of the second phase frequency detector means and an inverted version of the output signal of the second phase frequency detector means; and
    further secondary charge pump means for providing a switched current K*Ir for use in generating the second control signal in response to the output signal of the first phase frequency detector and an inverted version of the output signal of the first phase frequency detector, where the secondary charge pump provides.

15. The triangle waveform generator of claim 12, where the window detection means comprises:
    first comparator means for generating an output signal in response to a comparison between the generated triangle waveform and an upper threshold voltage;
    second comparator means for generating an output signal in response to a comparison between the generated triangle waveform and a lower threshold voltage; and
    a flip-flop responsive to the output signals of the first and second comparator means to generate the window comparator signal.

16. A triangle waveform generator comprising:
    a capacitive element;
    a regulator configured to charge and discharge the capacitive element, where the regulator is responsive to a first control signal to charge the capacitive element and a second control signal to discharge the capacitive element to thereby generate a triangle waveform; and
    a control circuit responsive to a frequency and phase of a reference waveform to generate the first and second control signals, where the control circuit comprises
       a window detection circuit generating a window comparator signal in response to the generated triangle waveform,
       a first phase frequency detector generating an output signal in response to the window comparator signal and the reference waveform, and
       a second phase frequency detector generating an output signal in response to an inverted version of the window comparator signal and an inverted version of the reference waveform.

17. The triangle waveform generator of claim 16, where the control circuit further comprises:
    a first set of charge pumps adapted to generate the first control signal; and
    a second set of charge pumps adapted to generate the second control signal.

18. The triangle waveform generator of claim 17, where the first and second sets of charge pumps are cross-coupled with one another to generate the first and second control signals.

19. The triangle waveform generator of claim 17, where the first set of charge pumps comprises:
    a main charge pump responsive to the output signal of the first phase frequency detector and an inverted version of the output signal of the first phase frequency detector, where the main charge pump provides a switched current Ir for use in generating the first control signal; and
    a secondary charge pump responsive to the output signal of the second phase frequency detector and an inverted version of the output signal of the second phase frequency detector, where the secondary charge pump provides a switched current K*Ir for use in generating the first control signal.

20. The triangle waveform generator of claim 19, where the second set of charge pumps comprises:
    a further main charge pump responsive to the output signal of the second phase frequency detector and an inverted version of the output signal of the second phase frequency detector, where the further main charge pump provides a switched current Ir for use in generating the second control signal; and
    a further secondary charge pump responsive to the output signal of the first phase frequency detector and an inverted version of the output signal of the first phase frequency detector, where the secondary charge pump provides a switched current K*Ir for use in generating the second control signal.

21. The triangle waveform generator of claim 16, where the window detection circuit comprises:
 a first comparator disposed to compare the generated triangle waveform with an upper threshold voltage to generate a corresponding output signal;
 a second comparator disposed to compare the generated triangle waveform with a lower threshold voltage to generate a corresponding output signal; and
 a flip-flop responsive to the output signals of the first and second comparators to generate the window comparator signal.

22. The triangle waveform generator of claim 21, where the flip-flop is further responsive to the output signals of the first and second comparators to generate the inverted version of the window comparator signal.

23. A triangle waveform generator comprising:
 means for storing an electrical charge;
 regulator means for charging and discharging the means for storing, where the regulator means is responsive to a first control signal to charge the means for storing and a second control signal to discharge the means for storing to thereby generate a triangle waveform; and
 control means for generating the first and second control signals in response to a frequency and phase of a reference waveform, where the control means comprises
  window detection means for generating a window comparator signal in response to the generated triangle waveform,
  first phase frequency detector means for generating an output signal in response to the window comparator signal and the reference waveform, and
  second phase frequency detector means for generating an output signal in response to an inverted version of the window comparator signal and an inverted version of the reference waveform.

* * * * *

UNITED STATES PATENT AND TRADEMARK OFFICE
CERTIFICATE OF CORRECTION

PATENT NO. : 7,557,622 B2 Page 1 of 1
APPLICATION NO. : 11/542756
DATED : July 7, 2009
INVENTOR(S) : Gerald R. Stanley It is certified that error appears in the above-identified patent and that said Letters Patent is hereby corrected as shown below:

Column 6, line 66, change "356" to --366-- and "358" to --368--

Signed and Sealed this

Twenty-sixth Day of October, 2010

David J. Kappos
*Director of the United States Patent and Trademark Office*